(12) United States Patent
Eichler et al.

(10) Patent No.: US 9,124,072 B2
(45) Date of Patent: Sep. 1, 2015

(54) METHODS OF PRODUCING OPTOELECTRONIC SEMICONDUCTOR COMPONENTS, AND OPTOELECTRONIC SEMICONDUCTOR LASERS

(71) Applicant: OSRAM Opto Semiconductors GmbH, Regensburg (DE)

(72) Inventors: Christoph Eichler, Tegernheim (DE); Sönke Tautz, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/501,213

(22) Filed: Sep. 30, 2014

(65) Prior Publication Data

US 2015/0049776 A1    Feb. 19, 2015

Related U.S. Application Data

(63) Continuation of application No. 13/653,537, filed on Oct. 17, 2012, now Pat. No. 8,879,597.

(60) Provisional application No. 61/590,375, filed on Jan. 25, 2012.

(30) Foreign Application Priority Data

Oct. 31, 2011   (DE) .................. 10 2011 054 954

(51) Int. Cl.
*H01S 5/00* (2006.01)
*H01S 5/343* (2006.01)
(Continued)

(52) U.S. Cl.
CPC ............. *H01S 5/34333* (2013.01); *G02B 1/11* (2013.01); *H01L 33/58* (2013.01); *H01S 5/0206* (2013.01);
(Continued)

(58) Field of Classification Search
CPC ............. H01S 5/0281; H01S 5/32341; H01S 2301/16; H01S 5/0286; H01S 5/0206; H01S 230/118; H01S 2301/18; G02B 1/11
USPC .................. 372/44.01, 49.01, 45.01; 438/29; 359/601
See application file for complete search history.

(56) References Cited

U.S. PATENT DOCUMENTS 4,280,107 A    7/1981  Scifres et al.
5,180,685 A    1/1993  Yamamoto et al.
(Continued)

FOREIGN PATENT DOCUMENTS

DE           40 25 144 A1    2/1991
DE    10 2008 012 859 A1   11/2009
(Continued)

*Primary Examiner* — Tuan Nguyen
(74) *Attorney, Agent, or Firm* — DLA Piper LLP (57) ABSTRACT

An optoelectronic semiconductor laser includes a growth substrate; a semiconductor layer sequence that generates laser radiation; a front facet at the growth substrate and at the semiconductor layer sequence, wherein the front facet constitutes a main light exit side for the laser radiation generated in the semiconductor laser and has a light exit region at the semiconductor layer sequence; a light blocking layer for the laser radiation, which partly covers at least the growth substrate at the front facet such that the light exit region is not covered by the light blocking layer; and a bonding pad at a side of the semiconductor layer sequence facing away from the growth substrate, wherein a distance between the bonding pad and the light blocking layer at least at the light exit region is 0.1 μm to 100 μm.

14 Claims, 8 Drawing Sheets

(51) Int. Cl.
  *G02B 1/11* (2015.01)
  *H01L 33/58* (2010.01)
  *H01S 5/02* (2006.01)
  *H01S 5/026* (2006.01)
  *H01S 5/20* (2006.01)
  *H01S 5/22* (2006.01)
  *H01S 5/028* (2006.01)
  *H01S 5/323* (2006.01)

(52) U.S. Cl.
  CPC ............ *H01S 5/0264* (2013.01); *H01S 5/0286* (2013.01); *H01S 5/2018* (2013.01); *H01S 5/22* (2013.01); *H01S 5/0281* (2013.01); *H01S 5/32341* (2013.01); *H01S 2301/16* (2013.01); *H01S 2301/18* (2013.01)

(56) References Cited

U.S. PATENT DOCUMENTS

| | | | |
|---|---|---|---|
| 5,185,290 | A | 2/1993 | Aoyagi et al. |
| 6,347,107 | B1 | 2/2002 | Roddy et al. |
| 2003/0058910 | A1 | 3/2003 | Gruber et al. |
| 2004/0213315 | A1 | 10/2004 | Kume et al. |
| 2005/0101039 | A1 | 5/2005 | Chen et al. |
| 2006/0239311 | A1 | 10/2006 | Kume et al. |
| 2008/0102546 | A1* | 5/2008 | Ryu et al. ............ 438/29 |
| 2010/0146623 | A1 | 6/2010 | Namjoshi et al. |
| 2010/0246623 | A1* | 9/2010 | Okunuki ............ 372/45.01 |
| 2011/0188530 | A1 | 8/2011 | Lell et al. |

FOREIGN PATENT DOCUMENTS

| | | |
|---|---|---|
| DE | 10 2010 043 693 A1 | 3/2012 |
| JP | 6-204609 | 7/1994 |
| JP | 7-140484 | 6/1995 |
| JP | 2001-68784 | 3/2001 |
| JP | 2002-280663 A | 9/2002 |
| JP | 2003-133648 | 5/2003 |
| JP | 2003-347649 A | 12/2003 |
| JP | 2004-327637 A | 11/2004 |
| JP | 2005-101457 A | 4/2005 |
| WO | 03/044571 A2 | 5/2003 |
| WO | 2011/128233 A1 | 10/2011 |
| WO | 2012/041678 A1 | 4/2012 |

* cited by examiner

METHODS OF PRODUCING OPTOELECTRONIC SEMICONDUCTOR COMPONENTS, AND OPTOELECTRONIC SEMICONDUCTOR LASERS

TECHNICAL FIELD

This disclosure relates to methods of producing optoelectronic semiconductor components and optoelectronic semiconductor lasers.

BACKGROUND

There is a need for an optoelectronic semiconductor laser wherein a substrate mode is suppressed.

SUMMARY

We provide a method of producing an optoelectronic semiconductor component including epitaxially growing a semiconductor layer sequence including at least one active layer on a growth substrate, shaping a front facet at the semiconductor layer sequence and the growth substrate, wherein the front facet is a main light exit side for radiation generated in the semiconductor component, coating a part of the front facet with a light blocking layer for the radiation generated in the semiconductor component, wherein the light blocking layer is produced by a directional coating method and the light blocking layer is structured during coating by shading by the growth substrate and/or by at least one dummy bar arranged at and/or alongside the growth substrate.

We also provide an optoelectronic semiconductor laser including a growth substrate, a semiconductor layer sequence that generates laser radiation, a front facet at the growth substrate and at the semiconductor layer sequence which constitutes a main light exit side for the laser radiation generated in the semiconductor laser and has a light exit region at the semiconductor layer sequence, and a light blocking layer for the laser radiation, which partly covers at least the growth substrate at the front facet such that the light exit region is not covered by the light blocking layer.

We further provide a light blocking layer for an optoelectronic semiconductor laser having an emission wavelength $\lambda$, including at least one first and at least one second partial layer, wherein the first and second partial layers alternately succeed one another, two adjacent partial layers, with a tolerance of at most $\lambda/7$, have an optical thickness of $\lambda/2$, the second partial layers include a material absorbent for the emission wavelength $\lambda$, the first partial layers include a material transmissive for the emission wavelength $\lambda$, and the light blocking layer includes a total of 2 to 20 of the partial layers.

DETAILED DESCRIPTION

It will be appreciated that the following description is intended to refer to specific examples of structure selected for illustration in the drawings and is not intended to define or limit the disclosure, other than in the appended claims.

We provide methods that may comprise the step of growing a semiconductor layer sequence comprising at least one active layer on a growth substrate. The growth substrate can be a transparent, radiation-transmissive substrate such as a GaN substrate. The semiconductor layer sequence is grown epitaxially, for example, by metal organic vapor phase epitaxy, MOVPE for short.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$, wherein in each case $0 \leq n \leq 1$, $0 \leq m \leq 1$ and $n+m \leq 1$. The semiconductor layer sequence can comprise dopants and additional constituents. For the sake of simplicity, however, only the essential constituents for the crystal lattice of the semiconductor layer sequence, that is to say Al, As, Ga, In, N or P, are specified, even if they can be replaced and/or supplemented in part by small amounts of further substances.

The semiconductor layer sequence comprises at least one active layer designed to generate an electromagnetic radiation. The active layer comprises, in particular, at least one pn junction or, preferably, one or more quantum well structures. Radiation generated by the active layer during operation is, in particular, in the spectral range of 380 nm to 550 nm or 420 nm to 540 nm.

A front facet may be shaped at the semiconductor layer sequence and at the growth substrate. Shaping the front facet is preferably effected after epitaxially growing the semiconductor layer sequence. The facet is produced, in particular, by virtue of the fact that the growth substrate on which the semiconductor layer sequence is applied is split up, for example, by cleavage. It is likewise possible for the facet to be produced by etching. A projection can then be formed at the growth substrate and/or at the semiconductor layer sequence.

The front facet may be designed as a main light exit side for radiation generated in the finished semiconductor component. By way of example, the front facet is designed as the sole side to provide radiation from the optoelectronic semiconductor component for a selected application. The front facet is preferably a smooth, planar area. An average roughness of the front facet is, for example, at most 100 nm or at most 50 nm.

The method may comprise the step of coating a part of the front facet with a light blocking layer. The light blocking layer is designed to block a part of the radiation generated in the finished semiconductor component. In other words, the light blocking layer is opaque to at least one part of the radiation generated in the active layer in the semiconductor layer sequence. A transmission for radiation generated in the active layer through the light blocking layer is preferably at most 80% or at most 10% or at most 1% or at most 0.2%. It is possible for the light blocking layer to be completely opaque to the radiation generated in the active layer during the operation of the semiconductor component.

The light blocking layer may be produced by a directional coating method. Directional means that a material from which the light blocking layer is shaped is applied to the front facet from a specific direction or a narrowly defined direction range. The coating method is, for example, molecular beam epitaxy, MBE for short, or vapor deposition. The coating method can likewise be realized by ion beam deposition, or IBD for short, or by sputtering.

In contrast thereto, non-directional coating methods are those in which a coating with a material is effected independently of an orientation of areas to be coated. Such coating methods in which no or only a comparatively low directional selectivity occurs are, for example, CVD, MOVPE or atomic layer deposition, ALD for short.

The light blocking layer may be applied in a structured fashion. That is to say that the light blocking layer does not completely cover the front facet and a part of the light exit side is deliberately not coated with the light blocking layer.

The light blocking layer may be structured by shading. Shading can mean that, as seen from a coating direction, the complete front facet is not freely accessible.

The shading during coating with the light blocking layer may be effected by the growth substrate on which the semiconductor layer sequence is grown. It is likewise possible for the shading to be effected by a dummy bar arranged at and/or alongside the growth substrate. No semiconductor layer sequence comprising the active layer is then deposited on the dummy bar. In particular, no optoelectronic semiconductor component is produced from the dummy bar.

The method may be designed to produce an optoelectronic semiconductor component and comprises at least the following steps, preferably in the order indicated:
  epitaxially growing a semiconductor layer sequence comprising at least one active layer on a growth substrate,
  shaping a front facet at the semiconductor layer sequence and at the growth substrate, wherein the front facet is preferably designed as a main light exit side for radiation generated in the finished semiconductor component,
  coating a part of the front facet with a light blocking layer for the radiation generated in the finished semiconductor component, and completing the semiconductor component.

In this case, the light blocking layer is produced by a directional coating method and the light blocking layer is structured during coating by shading by the growth substrate and/or by at least one dummy bar arranged at and/or alongside the growth substrate.

The optoelectronic semiconductor component produced may be a semiconductor laser. The semiconductor component is then designed to emit laser radiation. In particular, the semiconductor laser is an edge emitting laser, preferably a so-called "ridge" laser.

In the case of semiconductor lasers whose carrier substrate or growth substrate is transparent to a laser radiation, spontaneously emitted light or else stray light can propagate alongside the actual laser mode in the substrate. In the case of laser radiation in the visible spectral range, the substrate therefore then itself appears luminous. This radiation guided in the substrate can emerge at the front facet of the semiconductor laser and thereby reduces beam quality since the radiation no longer emerges from a single point-like region at the front facet.

Particularly if the semiconductor laser is used for laser projection by flying spot technology, this luminous emission of the substrate itself can lead to undesirable imaging aberrations in a projected image. By way of example, during projection a disturbing, so-called "halo" can arise around the actual image. In other applications, too, which require a good beam quality or a point light source, for example, in data storage, a luminous substrate is undesirable.

By applying the light blocking layer in places at the front facet, the emergence of radiation guided undesirably in the substrate can be prevented or greatly reduced. A quality of the radiation emitted by the semiconductor laser is thereby increased.

This applies, in particular, if a semipolar GaN substrate is used as a growth substrate for lasers emitting in the UV or emitting in the blue or in the green spectral range or if an AlGaN-free laser is involved. In the case of such lasers, distinct cladding layers are dispensed with and beam guiding in the component is effected, for example, substantially only via InGaN layers. Substrate modes can be particularly pronounced.

The coating with the light blocking layer may be effected while a plurality of the growth substrates with the semiconductor layer sequences are assembled in a rack. That means that a plurality of the growth substrates and/or a plurality of the dummy bars are arranged closely adjacent, wherein the front facets of the growth substrates with the semiconductor layer sequences preferably all face in the same direction. In this case, the front facets are formed, in particular, by end sides of the growth substrates with the semiconductor layer sequences.

No dummy bar may be situated between at least two adjacent growth substrates. In particular, a dummy bar may be situated between no adjacent growth substrates. That is to say that the growth substrates with the semiconductor layer sequences can be arranged directly adjacent in the rack.

The front facets may be arranged parallel to one another during coating with the light blocking layer and therefore face in the same direction. Furthermore, the front facets, in a direction perpendicular to one of the front facets, are arranged offset with respect to one another. In other words, the rack with the growth substrates then appears, as seen in side view, sawtooth-like at the front facets.

A dummy bar may be situated between at least two of the growth substrates with the semiconductor layer sequences. Preferably, the dummy bars and growth substrates with the semiconductor layer sequences succeed one another alternately and in an alternating fashion.

The dummy bars may project beyond the front facet during coating with the light blocking layer. In other words, it is then possible that at one side or, preferably, at both sides of the front facet, as seen in side view, dummy bars are situated and end sides of the dummy bars project from the rack, relative to the front facets.

A coating direction during coating of the light blocking layer may be oriented obliquely with respect to the front facets. That is to say that the coating direction may have an angle not equal to 90° with respect to the front facets. As a result, it is possible that, during coating with the light blocking layer, shading is effected by the dummy bars or by adjacent growth substrates.

At least one of the dummy bars or all of the dummy bars which are provided for shading may have a projection. The projection preferably extends in a direction parallel to the end sides of the dummy bars. As seen in a plan view of the front facet, the latter is partly covered by the projection. The projection serves as shading during coating with the light blocking layer. It is possible that the projection is not in direct physical contact with the growth substrate and/or with the semiconductor layer sequence.

The front facet, as seen in a plan view perpendicularly with respect to the front facet, during coating with the light blocking layer, is not covered by the growth substrate and/or the dummy bar. That is to say that, as seen in a direction perpendicularly with respect to the front facet, the complete front facet is then freely accessible.

The light blocking layer may be applied in a structured fashion by the shading along a lateral direction. In this case, the lateral direction is oriented perpendicularly to a growth direction of the semiconductor layer sequence and preferably also perpendicularly to a normal to the front facets. In other words, the light blocking layer is then structured two-dimensionally. A part of the light blocking layer can then be applied in at least one region laterally alongside a light exit region.

The light exit region is, in particular, that region at the front facet in which the laser radiation intentionally leaves the semiconductor laser and/or the semiconductor layer sequence and the growth substrate, for example, a region in which a fundamental mode of the laser radiation reaches the front facet. The light exit region is formed, in particular, by a partial region of the semiconductor layer sequence and/or by a partial region of the growth substrate near the semiconductor layer sequence.

Furthermore, we provide optoelectronic semiconductor lasers. By way of example, the semiconductor lasers are produced by methods as described in conjunction with one or more of the examples mentioned above. Therefore, features of the methods are also disclosed for the semiconductor lasers, and vice versa.

The semiconductor laser may comprise a growth substrate and a semiconductor layer sequence to generate a laser radiation, wherein the semiconductor layer sequence is produced on the growth substrate. A front facet at the growth substrate and at the semiconductor layer sequence is designed as a main light exit side for the laser radiation generated in the semiconductor laser during operation and has a light exit region. A light blocking layer for the laser radiation is applied to the front facet only in places. The light blocking layer covers the growth substrate only in places. The light exit region is not covered by the light blocking layer.

Alternatively, it is possible for the growth substrate to be replaced by a carrier substrate which is different than the growth substrate.

The light blocking layer may be formed by first and second partial layers or comprise such partial layers, wherein the partial layers alternately succeed one another. The partial layers preferably have different optical refractive indexes for the laser radiation. Alternatively or additionally, it is possible for at least the first partial layers or at least the second partial layers to comprise a material which has an absorbing effect for the laser radiation having a wavelength $\lambda$.

In the semiconductor laser, a layer pair, consisting of one of the first and one of the second partial layers, may have a thickness of $\lambda/2$, preferably with a tolerance of at most $\lambda/7$ or of at most $\lambda/10$. In this case, the wavelength $\lambda$ denotes the wavelength of the highest intensity, the so-called "peak" wavelength. It is possible for the partial layers each to have a thickness of $\lambda/4$, with a tolerance of at most $\lambda/7$ or $\lambda/10$. The thickness of the partial layers in this case respectively designates the optical thickness, that is to say the product of the refractive index of a material of the corresponding partial layer for the wavelength $\lambda$ multiplied by the geometrical thickness.

The light blocking layer may comprise a total of four to 20 of the partial layers or two to ten of the partial layers or four to ten of the partial layers or consists of the stated number of partial layers. In other words, the light blocking layer then comprises one to five or two to five pairs of partial layers.

A bonding pad may be situated at a side of the semiconductor layer sequence which faces away from the growth substrate. The bonding pad is formed from a metallic material, for example, and is preferably designed to make electrical contact with the semiconductor layer sequence.

The distance between the bonding pad and the light blocking layer, for example, in a direction parallel to a growth direction of the semiconductor layer sequence, is at least 0.1 µm or at least 0.5 µm or at least 1 µm or at least 2 µm. Alternatively or additionally, the distance is at most 100 µm or at most 50 µm or at most 20 µm or at most 10 µm.

The light blocking layer may be shaped as a dielectric mirror, also known as a Bragg mirror. The light blocking layer then comprises alternating layers composed of a material having a high refractive index and a low refractive index, wherein the layers preferably each have an optical thickness of approximately $\lambda/4$ or wherein two adjacent layers have a thickness of approximately $\lambda/2$, wherein the optical thicknesses of adjacent layers can then deviate from one another by up to a factor of 3 or by up to a factor of 2 or by up to a factor of 1.25. By way of example, the mirror comprises 6 to 60 or 8 to 30 or 16 to 30 layers. Materials for the layers of the light blocking layer are then, in particular, oxides or nitrides or oxynitrides of Al, Ce, Ga, Hf, In, Mg, Nb, Rh, Sb, Si, Sn, Ta, Ti, Zn, Zr and the like.

The light blocking layer may be a metallic layer or a metallic layer stack. By way of example, the light blocking layer then comprises Ti and/or Cr or consists thereof. In this case, a thickness of the light blocking layer is preferably at least 0.1 nm or at least 10 nm or at least 50 nm and alternatively or additionally at most 10 µm or at most 2 µm or at most 1 µm.

The light blocking layer may comprise a metallic layer or consist thereof, in particular as specified above. Optionally, an electrically insulating and/or dielectric intermediate layer is then situated at a side of the light blocking layer which faces the semiconductor layer sequence. Leakage currents can be avoided or reduced by such an intermediate layer. Alternatively or additionally, an insulating and/or dielectric covering layer, for example, composed of an oxide or composed of a nitride, can be fitted at a side of the light blocking layer which faces away from the semiconductor layer sequence. Such a covering layer makes it possible to prevent the metallic light blocking layer from being wetted during soldering of the semiconductor laser and a solder from climbing up a facet. The in particular metallic light blocking layer can therefore be embedded between two electrically insulating layers. The light blocking layer can directly touch one or both of the electrically insulating layers.

The light blocking layer may be shaped from a semiconductor material absorbent for the laser radiation such as Si or Ge, or comprises such a material. The material can be doped to set the absorption properties.

An antireflection layer for the laser radiation generated in the semiconductor layer sequence may be situated in places or over the whole area at a side of the light blocking layer which faces away from the growth substrate. In other words, the light blocking layer is then situated partly or completely between the antireflection layer and the growth substrate. The antireflection layer preferably covers the light exit region.

The light blocking layer may be fitted in places or over the whole area at a rear side lying opposite the front facet. In particular, the light blocking layer may be fitted at the growth substrate at the rear side. Preferably, the light blocking layer at the rear side is formed from a material that is absorbent for the laser radiation or comprises such a material.

A highly reflective layer shaped as a resonator mirror for the laser radiation may be fitted in places or over the whole area at the rear side. It is possible for the light blocking layer to be situated at the rear side in places or completely between the highly reflective layer and the growth substrate and/or the semiconductor layer sequence.

The semiconductor laser may comprise at least one monitor diode. The monitor diode detects laser radiation generated in the semiconductor layer sequence and can be used for power readjustment of the semiconductor laser. The monitor diode is situated at the rear side of the growth substrate and is preferably designed to detect radiation emerging from the growth substrate.

Methods described here and optoelectronic semiconductor lasers described here are explained in greater detail below on the basis of examples with reference to the drawings. In this case, identical reference signs indicate identical elements in the individual drawings. In this case, however, relations to scale are not illustrated. Rather, individual elements may be illustrated with an exaggerated size to afford a better understanding.

Figure 1:
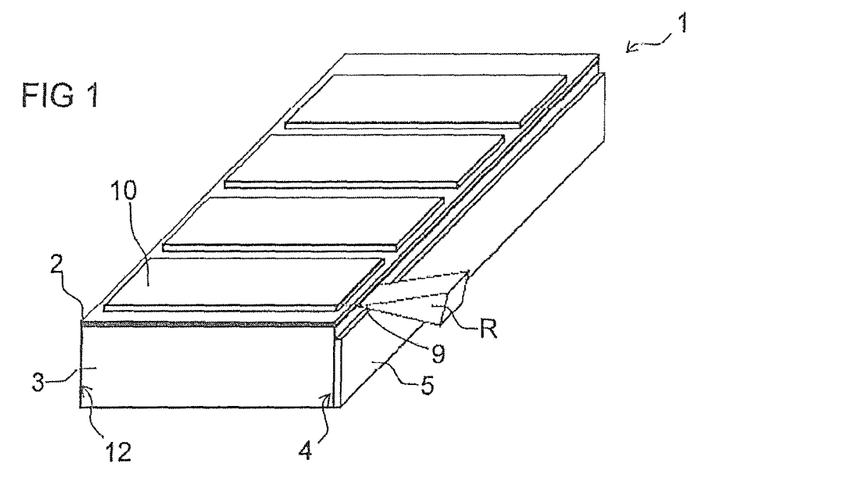
FIG. 1 shows a perspective schematic illustration of an example of an optoelectronic semiconductor laser.

Turning now to the drawings, FIG. 1 shows an example of an optoelectronic semiconductor component 1, which is preferably a semiconductor laser, in a perspective illustration. A semiconductor layer sequence 2 comprising an active layer that generates a laser radiation is fitted on a substrate 3, which can be a growth substrate. A plurality of bonding pads 10 are situated at a side of the semiconductor layer sequence 2 which faces away from the growth substrate 3. The bonding pads 10 make electrical contact with the semiconductor layer sequence 2. The bonding pads 10 are preferably electrically drivable independently of one another.

Individual layers of the semiconductor layer sequence 2 such as the active layer or such as cladding layers, waveguide layers, barrier layers, current spreading layers and/or current limiting layers are not depicted in each case to simplify illustration.

During the operation of the semiconductor component 1, a laser radiation R is generated in the semiconductor layer sequence 2. The laser radiation R emerges at a front facet 4 of the growth substrate 3 and the semiconductor layer sequence 2 in a light exit region 9. The light exit region 9 comprises a region at the front facet 4 which preferably corresponds to an exit area of the laser mode generated in the semiconductor layer sequence 2. The light exit region 9 lies, in particular, exactly opposite a required region of a resonator mirror at a rear side 12.

Figure 7:
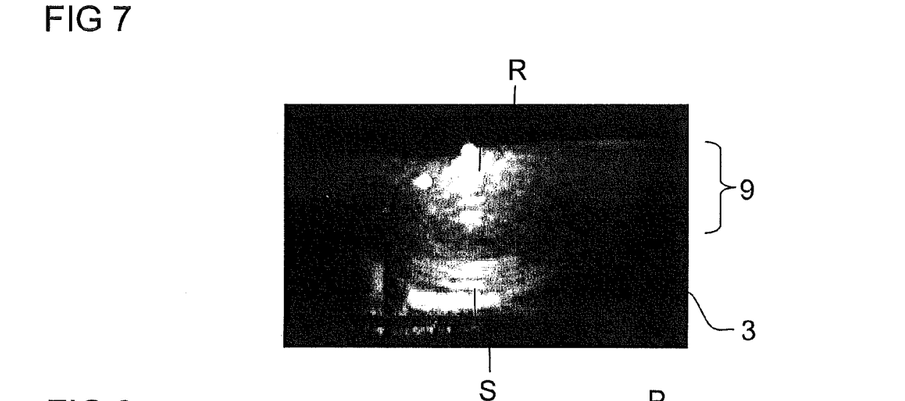
FIGS. 7 and 8 show images of radiation emissions of conventional semiconductor lasers.

On account of spontaneous emission, on account of stray radiation and/or owing to an overlap of an electric field of the laser mode with the substrate, light outside the actual desired laser mode of the radiation R can pass into the growth substrate 3. This light is designated as substrate mode S hereinafter. If the laser radiation R is blue or green light, then GaN, in particular, which is transparent to the radiation R, is used as growth substrate 3. It is thereby possible for radiation of the substrate mode S to propagate substantially in an unimpeded fashion in the growth substrate 3; also cf. FIG. 7.

Figure 8:
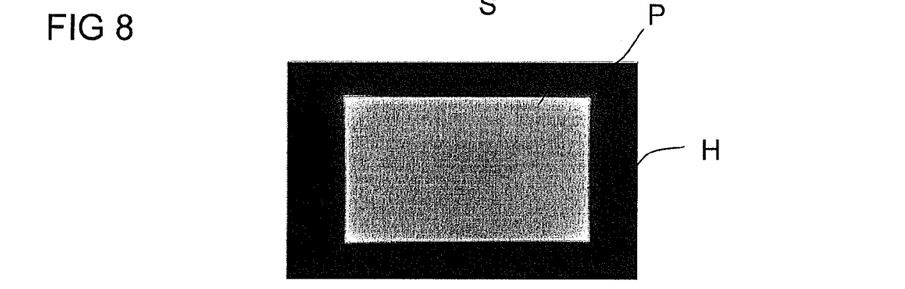

The substrate mode S, in comparison with the actual laser radiation R, has a comparatively large area proportion at the front facet 4 of the growth substrate 3. In other words, the growth substrate 3 then itself appears luminous and a beam quality is impaired on account of the substrate mode S. If the semiconductor laser 1 is used without further measures, for example, in the context of a flying spot application for projection, then a halo H can form around a projection region P, the halo impairing an image quality. This is illustrated in FIG. 8.

To avoid such a halo H and prevent light of the substrate mode S from being emitted from the growth substrate 3, a light blocking layer 5 is fitted at the front facet 4. The light blocking layer 5 is at least partly opaque to radiation having a wavelength of the laser radiation R. In other words, the light blocking layer 5 prevents the substrate mode S from leaving the growth substrate 3. The light blocking layer 5 is not applied to the growth substrate 3 over the whole area.

In a departure therefrom, it is alternatively possible for the light blocking layer 5 to cover the growth substrate 3 over the whole area at the front facet 4. It is likewise possible for a part of the semiconductor layer sequence 2 also to be covered by the light blocking layer 5 at the front facet 4. By way of example, a distance between an active zone of the semiconductor layer sequence 2 and the light blocking layer 5, in a direction parallel to the growth direction G, is at least 1 µm or at least 2 µm or at least 5 µm and alternatively or additionally at most 70 µm or at most 20 µm or at most 10 µm. The fact of whether the semiconductor layer sequence 2 is partly covered by the light blocking layer 5 can therefore be dependent on a thickness of the semiconductor layer sequence 2.

Figure 2A:
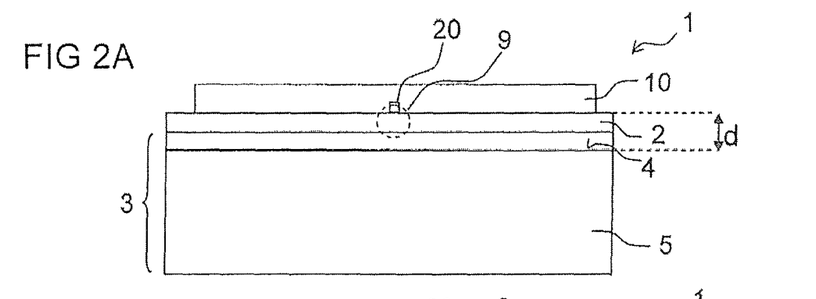
FIGS. 2A and 2B show planar views of the front facet of examples of a semiconductor laser.
Figure 2B:
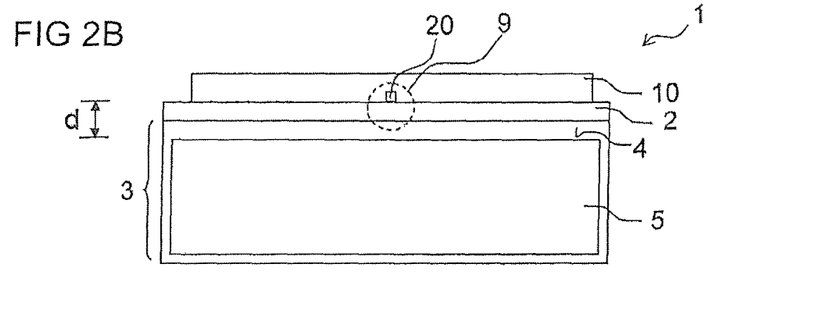

FIGS. 2A and 2B show examples of the semiconductor laser 1 in a plan view of the front facet 4. The semiconductor laser 1 comprises a ridge 20 of the semiconductor layer sequence 2 for impressing current and for guiding the radiation R. In other words, the semiconductor laser 1 is then shaped as a ridge laser. Such lasers are also specified in US 2003/0058910 A1, the subject matter of which is hereby incorporated by reference.

A distance d between the bonding pad 10 and the light blocking layer 5 is approximately 5 µm, for example. In this case, it is not necessary for the light blocking layer 5 to have an exactly identical thickness or an exactly identical material composition over its entire extent, as long as the light blocking layer 5 covers a sufficiently large proportion of the front facet 4 and is opaque or substantially opaque to wavelengths of the laser radiation 5 or has a sufficient absorption for such wavelengths. By way of example, in a manner governed by production engineering, an edge of the front facet 4 is free of the light blocking layer 5 all around, cf. FIG. 2B.

Figure 3:
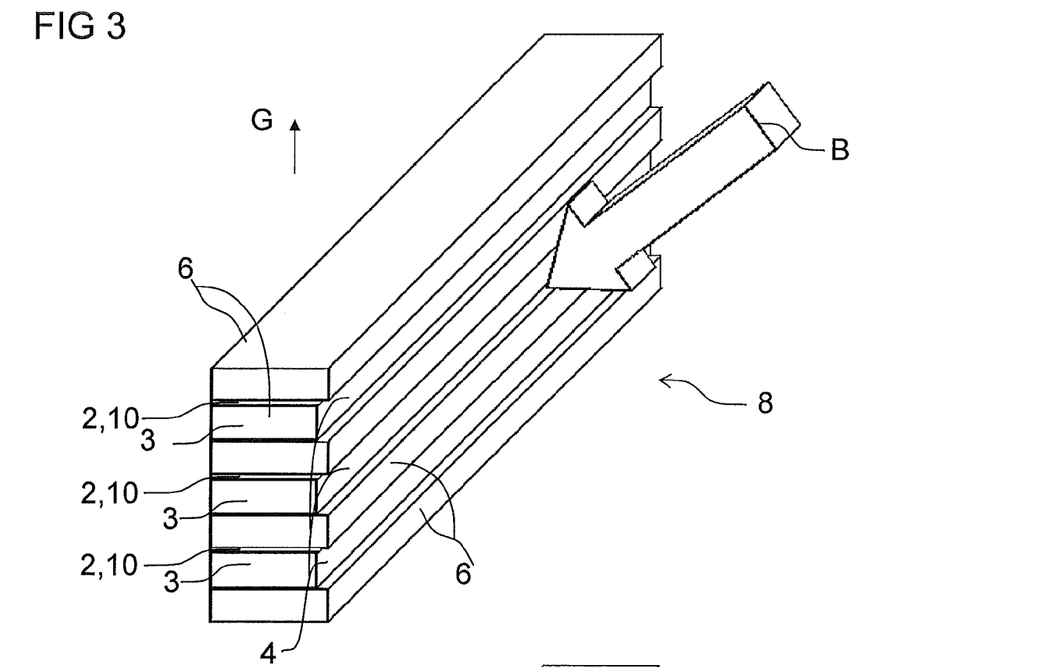
FIGS. 3-6 show schematic perspective views of selected portions of methods of producing a semiconductor component.

FIG. 3 illustrates a production method for the semiconductor component 1. Dummy bars 6 and the growth substrates 3 with the semiconductor layer sequences 2 and optionally the bonding pads 10 are arranged alternately in a rack 8. In this case, the dummy bars 6 project beyond the growth substrates 3 at the front facets 4 thereof.

The light blocking layer 5 applied to the front facets 4 is produced by a directional coating method. In this case, a coating is effected from the coating direction B. In a plane perpendicular to the front facets 4, an angle between the coating direction B and a growth direction G of the semiconductor layer sequences 2 is less than 90° or less than 85°. As a result, the front facets 4 near the semiconductor layer sequence 2 are shaded by the dummy bar 6 and the light blocking layer 5 is not applied in this region; also see FIGS. 1 and 2.

Alternatively or additionally, there is another possibility for realizing the shading during the production of the light blocking layer 5, by a separate shadow mask situated between the growth substrates 3 and a coating source.

Figure 4:
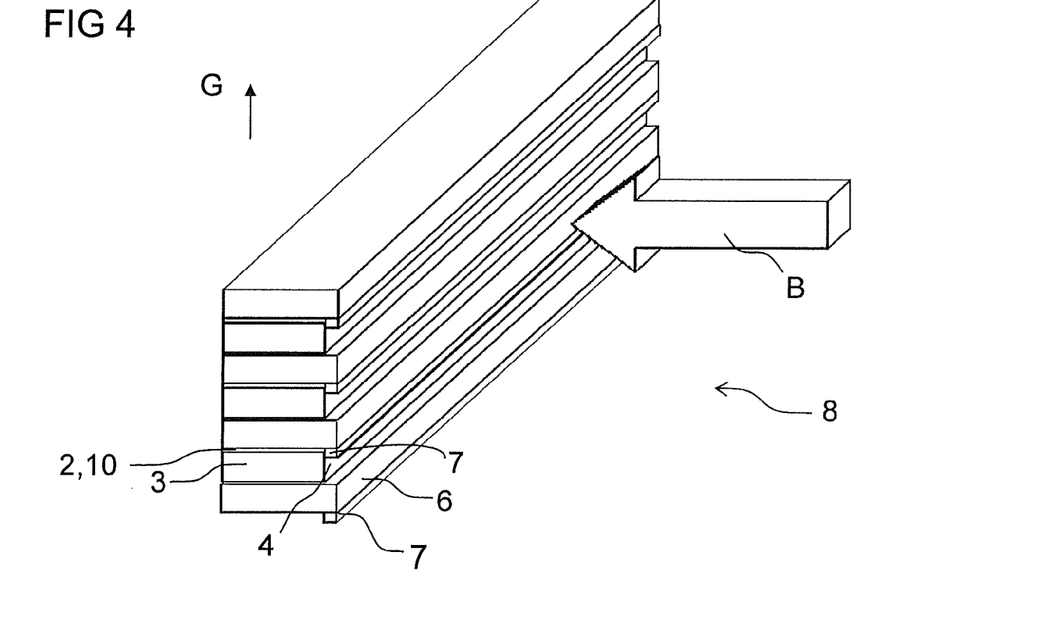

In the method in accordance with FIG. 4, the dummy bars 6 each have projections 7 which, as seen in a plan view of the front facets 4, cover the latter in a region near the semiconductor layer sequence 2. In this case, the projections 7 can be in contact with the front facet 4 or else, preferably, be spaced apart from the front facet 4. In this case, the coating direction B can be oriented perpendicularly to the front facets 4 or else, as in FIG. 3, be oriented obliquely with respect to the front facets 4.

Figure 5:
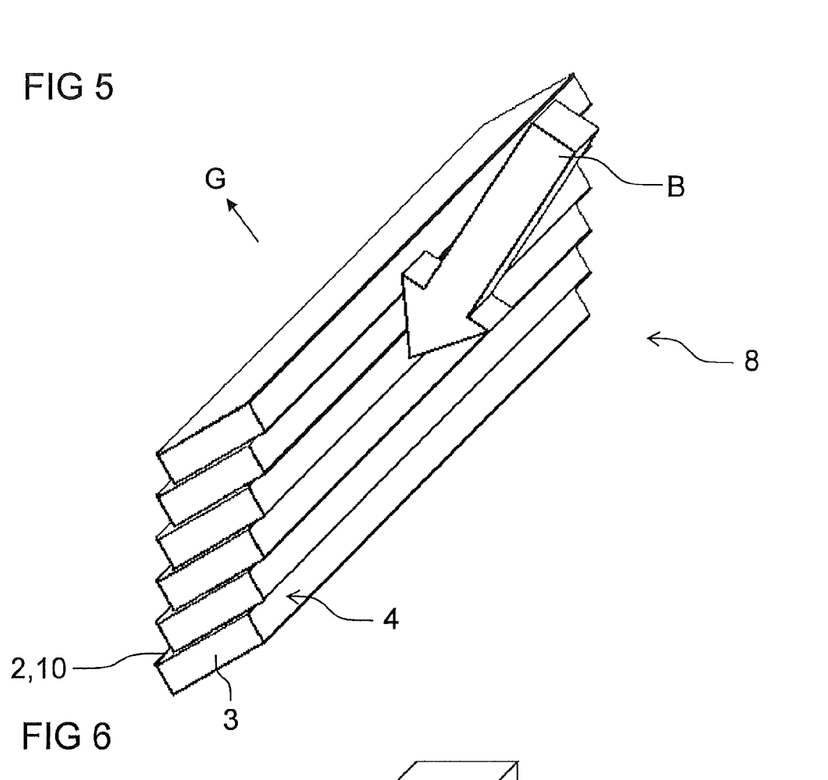

In the example of the method in accordance with FIG. 5, the rack 8, at least between the growth substrates 3, is free of dummy bars. The growth substrates 3 with the semiconductor layer sequences 2 and the optional bonding pads 10 are arranged in a sawtooth-like fashion, as seen in side view. In other words, the front facets 4 are in each case oriented parallel to one another, but offset relative to one another in a direction perpendicular to the front facets 4.

The growth substrate 3 which succeeds a growth substrate 3 along the growth direction G projects beyond the latter at the front facet 4 such that shading of the front facet 4 at the regions near the semiconductor layer sequence 2 is ensured. In a plane perpendicular to the front facets 4, an angle between the coating direction B and the growth direction G of the semiconductor layer sequences 2 is less than 90°.

In a departure from the illustration in accordance with FIG. 5, it is optionally possible, in the same way as, for instance, in accordance with FIG. 3 or 4, for dummy bars in each case to be situated between adjacent growth substrates 3 with the semiconductor layer sequences 2.

Figure 6:
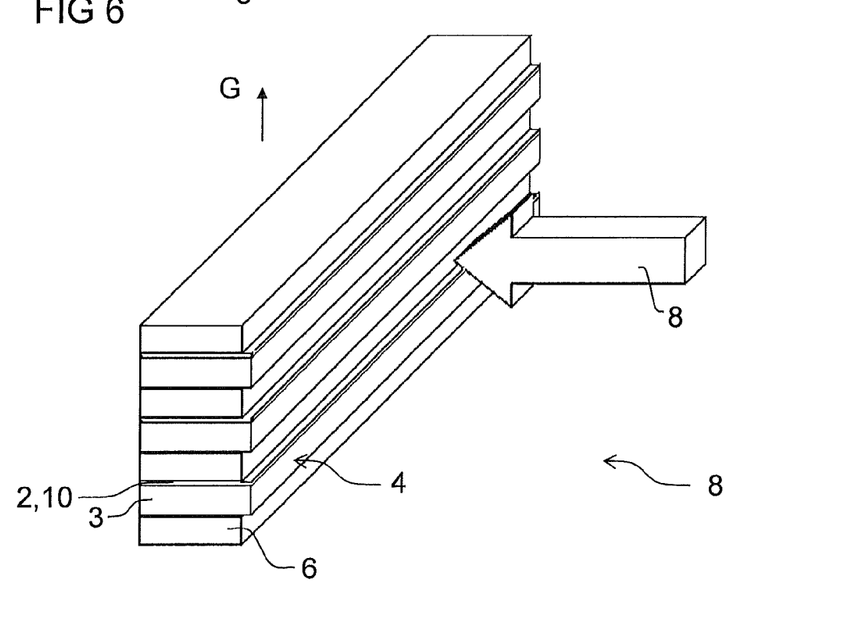

A conventional method is described in FIG. 6. In this case, the growth substrates 3 with the semiconductor layer sequences 2 are combined alternately with dummy bars 6 to form a rack 8. The growth substrates 3 with the front facets 4 project beyond the dummy bars 6. This ensures that the complete front facets 4 are coated. Therefore, partial regions of the front facets 4 are not shaded by such a method. Regionally applying the light blocking layer, for instance, is not possible with such a method.

Figure 9:
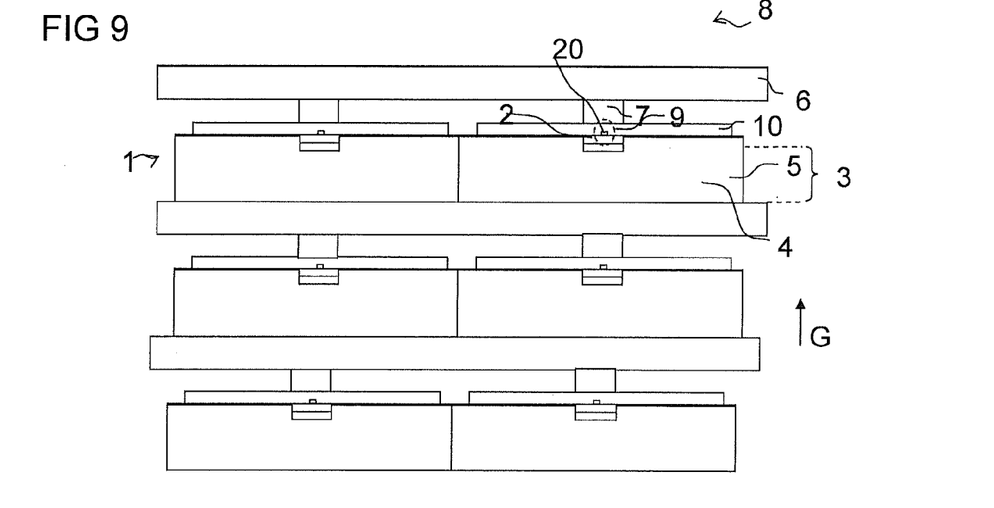
FIG. 9 shows schematic front elevational views of dummy bars.

A further example of the method is illustrated schematically in FIG. 9. In accordance with FIG. 9, the dummy bars 6 are structured in a lateral direction, that is to say in a direction in the plane of the drawing and perpendicular to the growth direction G. The dummy bars 6 have the projections 7. The projections 7 shade only a small region at the front facets 4 all around the light exit region 9. As a result, in a lateral direction only the ridge 20 and a small region of the semiconductor layer sequence 2 and of the growth substrate 3 are not covered by the light blocking layer 5.

Therefore, the light blocking layer 5 is also situated alongside the light exit region 9 in places in a lateral direction. A distance between the light blocking layer 5 and the ridge 20 all around is, for example, 0.1 µm to 100 µm or 0.5 µm to 50 µm or 1 µm and 20 µm. In the example in accordance with FIG. 9, the dummy bars 6 and the growth substrates 3 are preferably arranged in the rack 8 analogously to the example in accordance with FIG. 4.

Figure 10A:
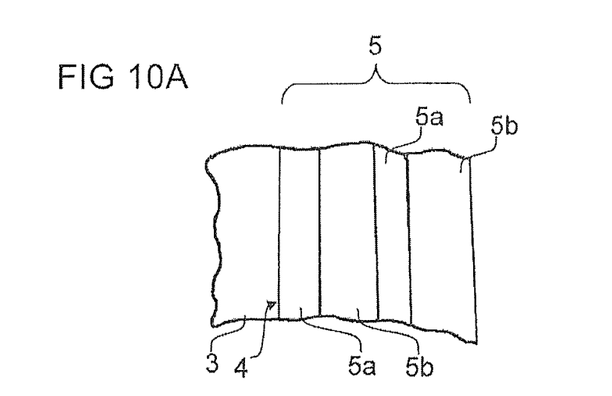
FIG. 10A shows a perspective schematic illustration of a light blocking layer.

FIG. 10A illustrates the light blocking layer 5 in greater detail. In accordance with FIG. 10A, the light blocking layer comprises two layer pairs of first partial layers 5a and second partial layers 5b. The light blocking layer 5 is shaped similarly to a Bragg mirror. The partial layers 5a, 5b preferably comprise materials having mutually different refractive indexes and each have a thickness of approximately λ/4, wherein λ denotes a principal wavelength of the laser radiation R.

By way of example the layers 5a are produced from titanium dioxide, and the layers 5b from silicon dioxide. Alternatively, it is possible for one type of the partial layers to have a thickness of 0.2λ or 0.4λ and to be shaped from aluminum oxide, for example, and for the other type of the partial layers to have a thickness of 0.3λ or 0.6λ and to be produced from hafnium oxide, for instance.

Preferably, either the first or the second partial layers are shaped with a material absorbent to the laser radiation R, for example, from silicon or germanium, and the other partial layers are shaped from a low refractive index material such as silicon dioxide or aluminum oxide. As a result, there is first a high reflectivity on account of the differences in refractive index between the layers and, secondly, the transmission is significantly reduced on account of the absorption of the other partial layers.

Figure 10B:
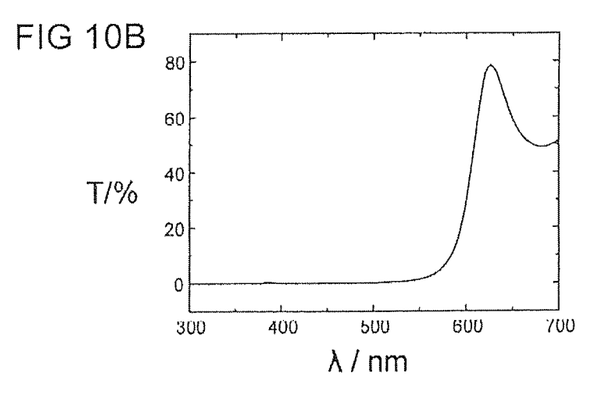
FIG. 10B is a graph of Transmission plotted against wave length $\lambda$ for a light blocking layer.
Figure 10C:
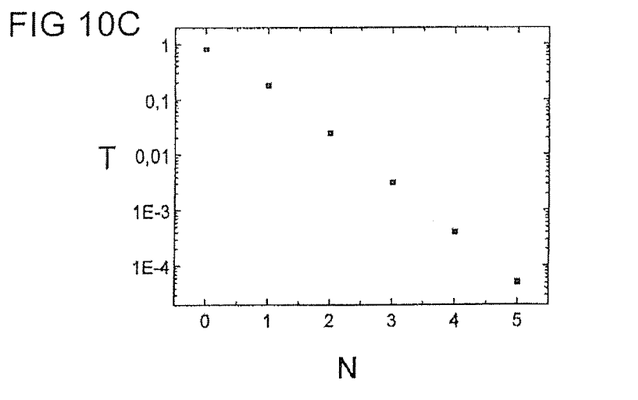
FIG. 10C shows a graph of Transmission T against the number N of mirror pairs.

In FIG. 10B, a transmission T in percent is plotted against the wavelength λ in nanometers for a light blocking layer 5 comprising four layer pairs each composed of λ/4 layers composed of aluminum oxide and silicon, that is to say that the light blocking layer comprises a total of eight partial layers. In the blue and in the green spectral range, the transmission T of such a light blocking layer 5 is below 1%. FIG. 10C furthermore illustrates the dependence of the transmission T on the number N of mirror pairs. With just five mirror pairs, corresponding to ten partial layers, the transmission at 450 nm is less than $10^{-4}$.

It is possible for such light blocking layers comprising partial layers having a thickness of approximately λ/4 and comprising layers composed of a low refractive index material and a radiation-absorbing material also to be used in other optoelectronic semiconductor components such as light emitting diodes, luminescence diodes or semiconductor lasers different than those described here such as surface emitting lasers, independently of the semiconductor components 1 described here. Preferably, such a light blocking layer then comprises one to five layer pairs and is produced from the materials specified above.

Figure 11:
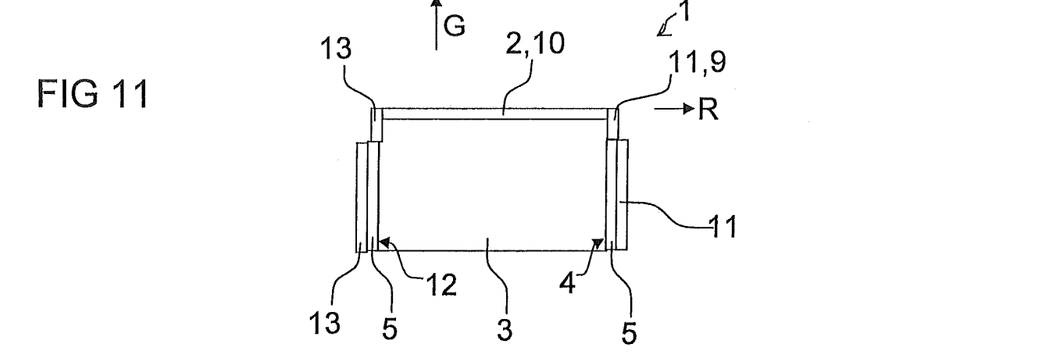
FIG. 11 shows a schematic side view of an example of semiconductor laser.

FIG. 11 illustrates a further example of the semiconductor laser 1 in a schematic side view. The light blocking layer 5 is fitted at the front facet 4 outside the light exit region 9, and likewise at the rear side 12. The light blocking layer 5 comprises a material that is absorbent for the laser radiation R. An antireflection layer 11 is applied over the entire front facet 4, such that the light blocking layer 5 is situated between the growth substrate 3 and the antireflection layer 11. A highly reflective layer 13 is correspondingly applied over the entire rear side 12. By the highly reflective layer 13, a resonator mirror for the laser radiation R is realized. With such absorbent light blocking layers 5 at the rear side 12, too, substrate modes S can be suppressed particularly efficiently.

In this case, antireflection layer can also mean that the layer 11 has a lower reflectivity than the highly reflective layer 13. It is then possible for the layer 11 to be embodied as a resonator mirror for the radiation R. By way of example, the layer 11 in this case has a reflectivity of 10% to 80% for the radiation R.

Figures 12, 13:
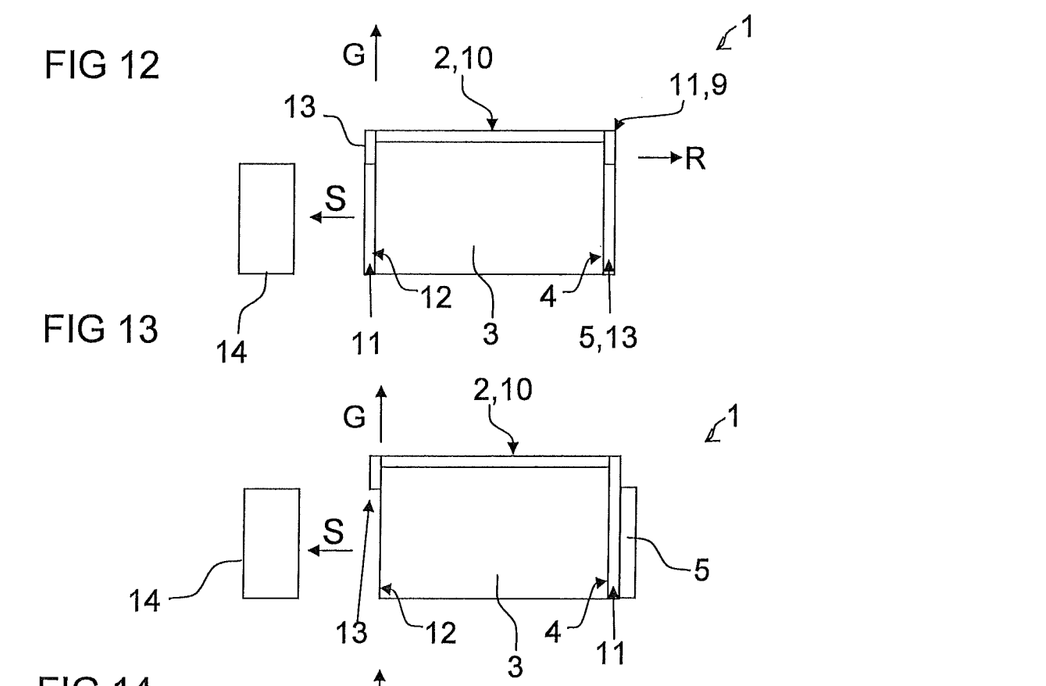
FIG. 12 schematically illustrates a light blocking layer and a highly reflective layer fitted at a rear side of an example of an optoelectronic semiconductor laser.
FIGS. 13 and 14 are yet another example of optoelectronic semiconductor laser.

In the example in accordance with FIG. 12, the light blocking layer 5 is realized by the highly reflective layer 13, which is also fitted at the rear side 12. However, as seen in side view, the highly reflective layer 13 at the rear side 12 covers only a region which lies opposite the light exit region 9 and which is required to support the fundamental mode of the laser radiation R. Remaining regions of the rear side 12 are covered with the antireflection layer 11.

Furthermore, the semiconductor component 1 comprises a monitor diode 14 fitted at the rear side 12 in the region of the antireflection layer 11. As a result, stray light passes from the growth substrate 3 through the antireflection layer 11 to the monitor diode 14. Consequently, a power of the semiconductor laser 1 can be readjusted by stray light. Such a monitor diode makes it possible to regulate the power of the semiconductor component 1 efficiently with the substrate mode S, without radiation R emitted at the front facet 4 having to be used for power readjustment.

In the case of the example in accordance with FIG. 13, no antireflection layer 11 is fitted at the rear side 12. The antireflection layer 11 at the front facet 4 is applied continuously and over the whole area and the light blocking layer 5 is situated at a side of the antireflection layer 11 which faces away from the growth substrate 3; also cf. FIG. 14.

Such highly reflective layers 13 and/or antireflection layers 11 can also be present in all other examples of the optoelectronic semiconductor component 1. A structuring of the antireflection layer 11 and/or of the highly reflective layer 13 can be effected analogously to the structuring of the light blocking layer 5 by directional coating methods in conjunction with shading.

Figure 14:
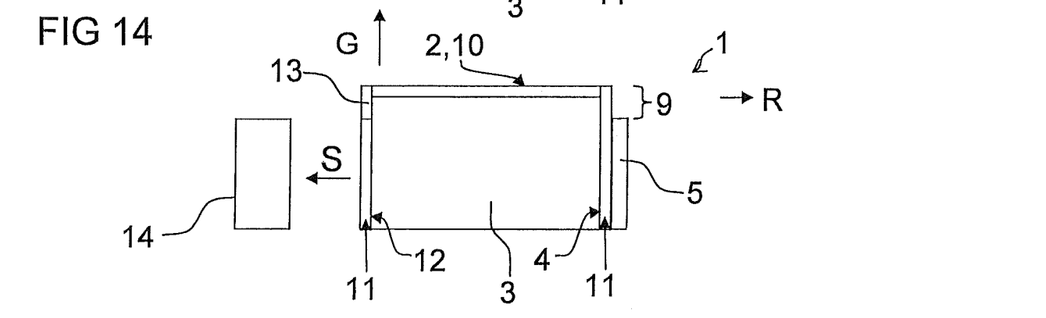

In the case of such a configuration of the semiconductor laser 1, as illustrated in FIG. 14, by repeated reflective coating with layers 13 and/or provision with antireflection layers 11, the reflectivity of the front facet 4 and of the rear side 12 can be deliberately set locally differently such that the radiation R is coupled out efficiently at the front facet 4, while the substrate mode S at the rear side 12 is guided efficiently to the monitor diode 14.

Figures 15A, 15B, 15C:
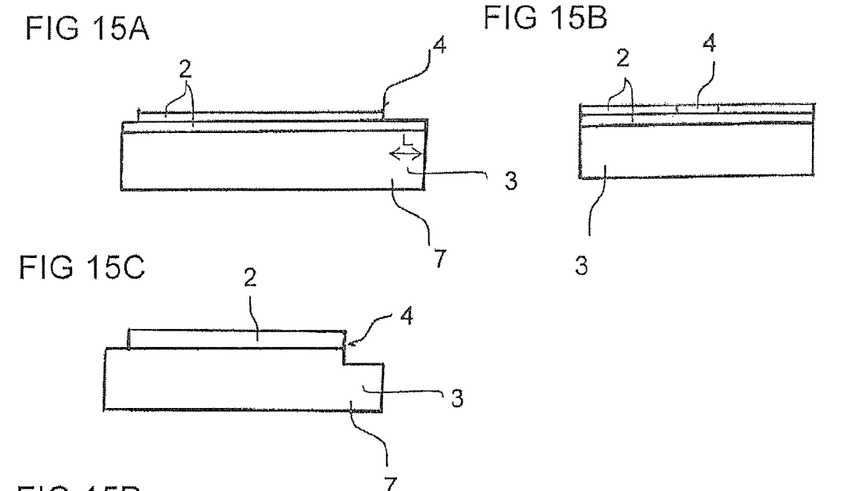
FIGS. 15A-15E schematically illustrate selected steps of a production method, in sequence, of an optoelectronic semiconductor component.

In the case of the example of the production method in accordance with FIG. 15, the front facet 4 is produced by etching, for example, by dry etching. In other words, a part of the semiconductor layer sequence 2 is then removed at least at the light exit side, see the sectional illustration in accordance with FIG. 15A and the front view in accordance with FIG. 15B. Alternatively, it is possible for the entire semiconductor layer sequence 2 and a part of the growth substrate 3 to be removed along the growth direction G to form the front facet 4, see FIG. 15C. The projection 7 is therefore formed by the growth substrate 3 itself. A length L of the projection 7, see FIG. 15A, is preferably at least 0.1 μm and furthermore preferably at most 100 μm or at most 20 μm or at most 10 μm.

Figure 15D:
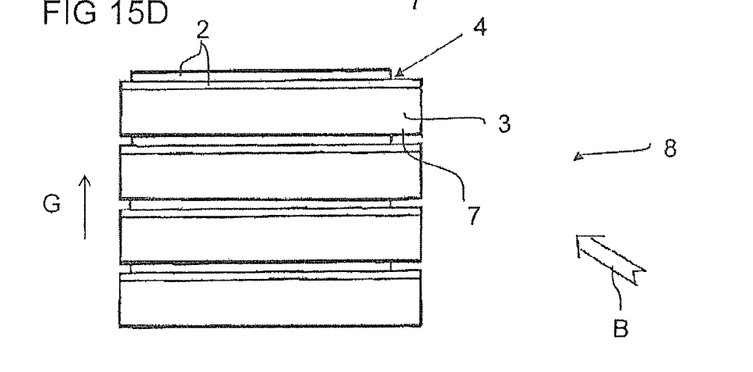
Figure 15E:
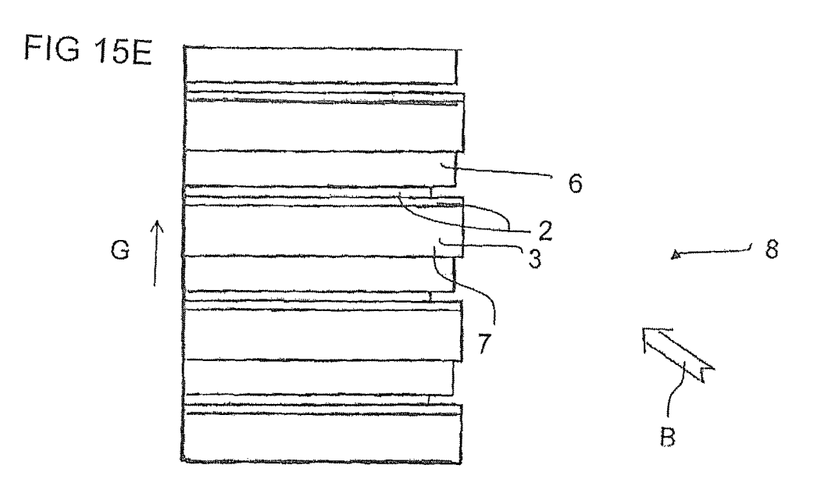

If the growth substrates 3 with the semiconductor layer sequences 2 are then combined to form the rack 8, then the shading can be obtained by the projection 7 during the production of the light blocking layer, which is not depicted in FIG. 15. The rack 8 can be free of dummy bars, see FIG. 15D, or else comprise the dummy bars 6, see FIG. 15E.

The methods, components and lasers described here are not restricted by the description on the basis of the examples. Moreover, this disclosure encompasses any novel feature and also any combination of features, which in particular includes any combination of features in the appended claims, even if the feature or combination itself is not explicitly specified in the claims or examples.

The invention claimed is:

1. An optoelectronic semiconductor laser comprising: a growth substrate, a semiconductor layer sequence that generates laser radiation, a front facet at the growth substrate and at the semiconductor layer sequence, wherein the front facet constitutes a main light exit side for the laser radiation generated in the semiconductor laser and has a light exit region at the semiconductor layer sequence, a light blocking layer for the laser radiation, which partly covers at least the growth substrate at the front facet such that the light exit region is not covered by the light blocking layer, and a bonding pad at a side of the semiconductor layer sequence facing away from the growth substrate, wherein a distance between the bonding pad and the light blocking layer at least at the light exit region is 0.1 um to 100 um; wherein the light blocking layer is a metallic layer or a metallic layer stack; wherein the growth substrate is transparent for the laser radiation, the laser radiation has a wavelength in the spectral range of 380 nm to 550 nm, and the semiconductor layer sequence is based on AlInGaN.

2. The optoelectronic semiconductor laser according to claim 1, wherein the light blocking layer has a thickness of 10 nm to 2 μm.

3. The optoelectronic semiconductor laser according to claim 2, wherein the light blocking layer is the metallic layer stack and consists of Ti and/or Cr, the light blocking layer having a thickness of at least 50 nm.

4. The optoelectronic semiconductor laser according to claim 2, wherein an electrically insulating layer is situated at a side of the light blocking layer facing the semiconductor layer sequence as well as at a side of the light blocking layer facing away from the semiconductor layer sequence.

5. The optoelectronic semiconductor laser according to claim 2, wherein an antireflection layer is applied continuously and over a whole area of the front facet, and the light blocking layer is situated at a side of the antireflection layer facing away from the growth substrate and the semiconductor layer sequence.

6. The optoelectronic semiconductor laser according to claim 2, wherein an antireflection layer for the laser radiation is applied over the entire front facet at a side of the light blocking layer facing away from the growth substrate, the antireflection layer covers the light exit region, and the light blocking layer is situated between the growth substrate and the antireflection layer.

7. The optoelectronic semiconductor laser according to claim 2, wherein the light blocking layer is applied at a rear side of the growth substrate, the rear side being opposite the front facet.

8. The optoelectronic semiconductor laser according to claim 2, wherein a plurality of the bonding pads are situated at a side of the semiconductor layer sequence facing away from the growth substrate, the bonding pads electrically contact the semiconductor layer sequence and are electrically drivable independent of one another, and the bonding pads are metallic.

9. The optoelectronic semiconductor laser according to claim 2, wherein an edge of the front facet is completely free of the light blocking layer.

10. The optoelectronic semiconductor laser according to claim 2, further comprising a monitor diode located at a rear side of the growth substrate,
wherein the rear side is opposite the front facet,
a highly reflective layer at the rear side covers only a region which lies opposite the light exit region and supports a fundamental mode of the laser radiation,
a remaining region of the rear side is covered with an antireflection layer, and
the monitor diode receives radiation from said remaining region.

11. The optoelectronic semiconductor laser according to claim 2, wherein the light blocking layer is applied in a structured fashion so that along a lateral direction perpendicular to a growth direction of the semiconductor layer sequence the light blocking layer is applied in at least one region laterally alongside the light exit region.

12. The optoelectronic semiconductor laser according to claim 2, further comprising a projection,
wherein at the projection the entire semiconductor layer sequence and a part of the growth substrate are removed along a growth direction of the semiconductor layer sequence to form the front facet, and
a length of the projection is 0.1 µm to 20 µm.

13. A method of producing the optoelectronic semiconductor component according to claim 1, comprising:
epitaxially growing a semiconductor layer sequence comprising at least one active layer on a growth substrate,
shaping a front facet at the semiconductor layer sequence and the growth substrate, wherein the front facet is a main light exit side for radiation generated in the finished semiconductor component,
coating a part of the front facet with a light blocking layer for the radiation generated in the finished semiconductor component,
wherein the light blocking layer is produced by a directional coating method and the light blocking layer is structured during coating by shading by the growth substrate and/or by at least one dummy bar arranged at the growth substrate,
a bonding pad is formed at a side of the semiconductor layer sequence facing away from the growth substrate, and
a distance between the bonding pad and the light blocking layer at least at the light exit region is 0.1 µm to 100 µm.

14. The method according to claim 13,
wherein no dummy bar is situated between at least two adjacent growth substrates, the front facets of said growth substrates are arranged parallel to one another and, in a direction perpendicular to one of the front facets, offset with respect to one another,
wherein a light exit region of the semiconductor layer sequence at the front facet, during coating with the light blocking layer, is neither covered by the growth substrate nor the dummy bar in a direction perpendicular to the front facet, and
wherein an edge emitting semiconductor ridge laser is produced, and the light blocking layer is produced while a plurality of the growth substrates are assembled to form a rack.

* * * * *